United States Patent
Khlat

(10) Patent No.: US 11,398,852 B2
(45) Date of Patent: Jul. 26, 2022

(54) ENVELOPE TRACKING POWER AMPLIFIER APPARATUS

(71) Applicant: Qorvo US, Inc., Greensboro, NC (US)

(72) Inventor: Nadim Khlat, Cugnaux (FR)

(73) Assignee: QORVO US, INC., Greensboro, NC (US)

( * ) Notice: Subject to any disclaimer, the term of this patent is extended or adjusted under 35 U.S.C. 154(b) by 0 days.

(21) Appl. No.: 16/742,976

(22) Filed: Jan. 15, 2020

(65) Prior Publication Data
US 2020/0403661 A1    Dec. 24, 2020

Related U.S. Application Data

(60) Provisional application No. 62/865,669, filed on Jun. 24, 2019.

(51) Int. Cl.
| | | |
|---|---|---|
| *H04B 7/0426* | (2017.01) | |
| *H04B 1/04* | (2006.01) | |
| *H03F 3/24* | (2006.01) | |

(52) U.S. Cl.
CPC ......... *H04B 7/0426* (2013.01); *H03F 3/245* (2013.01); *H04B 1/0475* (2013.01);
(Continued)

(58) Field of Classification Search
CPC .. H04B 7/0426; H04B 7/0483; H04B 7/0475; H04B 1/0483; H04B 1/0475;
(Continued)

(56) References Cited

U.S. PATENT DOCUMENTS

| | | |
|---|---|---|
| 6,720,829 B2 | 4/2004 | Matsuyoshi et al. |
| 7,256,649 B2 | 8/2007 | Ksienski et al. |
| | (Continued) | |

FOREIGN PATENT DOCUMENTS

| | | |
|---|---|---|
| EP | 1191707 A1 | 3/2002 |

OTHER PUBLICATIONS

Non-Final Office Action for U.S. Appl. No. 17/080,065, dated Jan. 13, 2022, 5 pages.
(Continued)

*Primary Examiner* — Ted M Wang
(74) *Attorney, Agent, or Firm* — Withrow & Terranova, P.L.L.C.

(57) ABSTRACT

An envelope tracking (ET) power amplifier apparatus is provided. The ET power amplifier apparatus includes a pair of power amplifiers configured to amplify a pair of radio frequency (RF) signals based on a pair of ET voltages. In one aspect, each of the RF signals is split before amplification and recombined after amplification. As such, the power amplifiers can operate based on half the peak power of the RF signals to help improve operating efficiency of the power amplifiers. In another aspect, the RF signals are pre-processed prior to amplification to form a pair of composite RF signals with similar average power such that the power amplifiers can operate based on substantially similar ET voltages. As a result, it may be possible to employ a single ET integrated circuit (ETIC) to provide the ET voltages, thus helping to reduce cost and footprint of the ET power amplifier apparatus.

18 Claims, 6 Drawing Sheets

(52) U.S. Cl.
CPC ..... *H04B 1/0483* (2013.01); *H03F 2200/102* (2013.01); *H03F 2200/336* (2013.01); *H03F 2200/45* (2013.01); *H04B 2001/0433* (2013.01)

(58) Field of Classification Search
CPC ............. H04B 2001/0433; H03F 3/245; H03F 2200/45; H03F 2200/102; H03F 2200/336
USPC ........................................................ 375/297
See application file for complete search history.

(56) References Cited

U.S. PATENT DOCUMENTS

| | | | |
|---|---|---|---|
| 8,761,834 B2 | 6/2014 | Luz et al. | |
| 10,211,785 B2 | 2/2019 | McLaren | |
| 2003/0214355 A1 | 11/2003 | Luz et al. | |
| 2009/0258617 A1* | 10/2009 | Yoshihara | H01P 5/10 455/127.1 |
| 2012/0229207 A1 | 9/2012 | Huang et al. | |
| 2014/0118063 A1* | 5/2014 | Briffa | H03F 3/211 330/124 R |
| 2016/0173031 A1* | 6/2016 | Langer | H03F 1/0222 330/126 |
| 2017/0005619 A1* | 1/2017 | Khlat | H03F 3/245 |

OTHER PUBLICATIONS

International Search Report and Written Opinion for PCT/US2021/054105, dated Jan. 21, 2022, 17 pages.

\* cited by examiner

US 11,398,852 B2

ENVELOPE TRACKING POWER AMPLIFIER APPARATUS

RELATED APPLICATIONS

This application claims the benefit of provisional patent application Ser. No. 62/865,669, filed Jun. 24, 2019, the disclosure of which is hereby incorporated herein by reference in its entirety.

FIELD OF THE DISCLOSURE

The technology of the disclosure relates generally to radio frequency (RF) power amplifier circuits.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

Fifth-generation new radio (5G-NR) wireless communication technology has been widely regarded as the next wireless communication standard beyond the current third-generation (3G) communication standard, such as wideband code division multiple access (WCDMA), and the fourth-generation (4G) communication standard, such as Long-Term Evolution (LTE). As such, a 5G-NR capable mobile communication device is expected to achieve significantly higher data rates, improved coverage range, enhanced signaling efficiency, and reduced latency compared with a conventional mobile communication device supporting only the 3G and 4G communication standards.

The 5G-NR capable mobile communication device can be configured to transmit a radio frequency (RF) signal(s) in a millimeter wave (mmWave) RF spectrum that is typically above 6 GHz. Notably, RF signals transmitted in the mmWave RF spectrum are more susceptible to propagation attenuation and interference. In this regard, the 5G-NR capable mobile communication device typically employs a power amplifier circuit(s) to help improve signal-to-noise ratio (SNR) and/or signal-to-interference-plus-noise ratio (SINR) of the RF signal(s). To mitigate the propagation attenuation, the 5G-NR capable mobile communication device may be configured to explore multipath diversity by simultaneously transmitting the RF signal(s) via multiple antennas. Furthermore, by simultaneously transmitting the RF signal(s) via multiple antennas, the 5G-NR capable mobile communication device may be able to increase data rates through spatial multiplexing.

Envelope tracking (ET) is a power management technique designed to improve operating efficiency of the power amplifier(s) to help reduce power consumption and thermal dissipation. More specifically, the power amplifier(s) is configured to amplify the RF signal(s) based on an ET voltage that rises and falls in accordance to an amplitude of the RF signal(s). Understandably, the better the ET voltage tracks the amplitude of the RF signal(s), the higher efficiency can be achieved in the power amplifier(s). In this regard, it may be desirable to provide the ET voltage in accordance to the amplitude of the RF signal(s), particularly when the 5G-NR capable mobile communication device is configured to support multiple-input multiple-output (MIMO) diversity and/or spatial multiplexing.

SUMMARY

Embodiments of the disclosure relate to an envelope tracking (ET) power amplifier apparatus. The ET power amplifier apparatus includes a pair of power amplifiers configured to amplify a pair of radio frequency (RF) signals based on a pair of ET voltages. In one aspect, each of the RF signals is split before amplification and recombined after amplification. As such, the power amplifiers can be configured to operate based on half peak power of the RF signals to help improve operating efficiency of the power amplifiers. In another aspect, the RF signals are pre-processed prior to amplification to form a pair of composite RF signals with similar average power such that the power amplifiers can operate based on substantially similar ET voltages. As a result, it may be possible to employ a single ET integrated circuit (ETIC) to provide the ET voltages to the power amplifiers, thus helping to reduce cost and footprint of the ET power amplifier apparatus.

In one aspect, an ET power amplifier apparatus is provided. The ET power amplifier apparatus includes a first signal output coupled to a first antenna. The ET power amplifier apparatus also includes a second signal output coupled to a second antenna. The ET power amplifier apparatus also includes a first power amplifier configured to amplify a first composite RF signal comprising a first RF signal and a second RF signal based on a first ET voltage. The ET power amplifier apparatus also includes a second power amplifier configured to amplify a second composite RF signal comprising the first RF signal and the second RF signal based on a second ET voltage. The ET power amplifier apparatus also includes an output circuit. The output circuit is configured to receive the first composite RF signal and the second composite RF signal from the first power amplifier and the second power amplifier, respectively. The output circuit is also configured to regenerate the first RF signal and the second RF signal from the first composite RF signal and the second composite RF signal. The output circuit is also configured to provide the first RF signal and the second RF signal to the first signal output and the second signal output, respectively.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
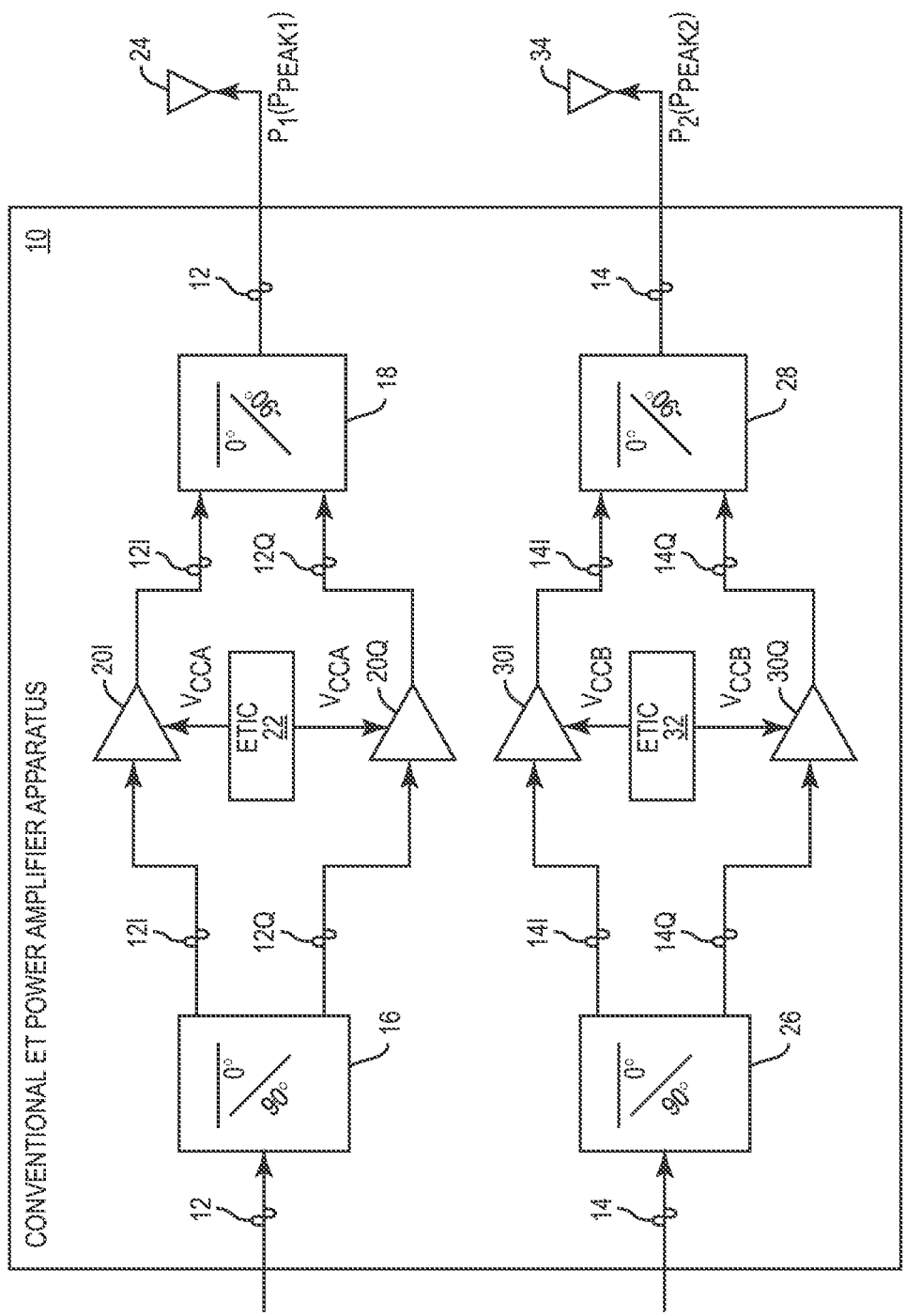
FIG. 1 is a schematic diagram of an exemplary conventional envelope tracking (ET) power amplifier apparatus configured to amplify a pair of radio frequency (RF) signals for concurrent transmission using a pair of ET integrated circuits (ETICs) and two pairs of power amplifiers.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to an envelope tracking (ET) power amplifier apparatus. The ET power amplifier apparatus includes a pair of power amplifiers configured to amplify a pair of radio frequency (RF) signals based on a pair of ET voltages. In one aspect, each of the RF signals is split before amplification and recombined after amplification. As such, the power amplifiers can be configured to operate based on half peak power of the RF signals to help improve operating efficiency of the power amplifiers. In another aspect, the RF signals are pre-processed prior to amplification to form a pair of composite RF signals with similar average power such that the power amplifiers can operate based on substantially similar ET voltages. As a result, it may be possible to employ a single ET integrated circuit (ETIC) to provide the ET voltages to the power amplifiers, thus helping to reduce cost and footprint of the ET power amplifier apparatus.

Before discussing an ET power amplifier apparatus of the present disclosure, a brief overview of a conventional ET power amplifier apparatus is first provided with reference to FIG. 1 to help understand the challenges associated with amplifying multiple RF signals for concurrent transmission. The discussion of specific exemplary aspects of an ET power amplifier apparatus of the present disclosure starts below with reference to FIG. 2.

In this regard, FIG. 1 is a schematic diagram of an exemplary conventional ET power amplifier apparatus 10 configured to amplify a first RF signal 12 and a second RF signal 14 for concurrent transmission at a first time-variant power $P_1$ and a second time-variant power $P_2$, respectively. Notably, the first time-variant power $P_1$ and the second time-variant power $P_2$ can be associated with a first peak power $P_{PEAK1}$ and a second peak power $P_{PEAK2}$, respectively.

The conventional ET power amplifier apparatus 10 includes a first signal splitter 16 and a first signal combiner 18. The first signal splitter 16 is configured to split the first RF signal 12 into a first in-phase RF signal 12I and a first quadrature RF signal 12Q. The conventional ET power amplifier apparatus 10 includes a pair of first power amplifiers 20I and 20Q configured to amplify the first in-phase RF signal 12I and the first quadrature RF signal 12Q, respectively, based on a first ET voltage $V_{CCA}$. The first ET voltage $V_{CCA}$ may be generated by a first ET integrated circuit (ETIC) 22. The first signal combiner 18 is configured to combine the first in-phase RF signal 12I and the first quadrature RF signal 12Q after amplification to regenerate the first RF signal 12 for transmission via a first antenna 24.

The conventional ET power amplifier apparatus 10 also includes a second signal splitter 26 and a second signal combiner 28. The second signal splitter 26 is configured to split the second RF signal 14 into a second in-phase RF signal 14I and a second quadrature RF signal 14Q. The conventional ET power amplifier apparatus 10 includes a pair of second power amplifiers 30I and 30Q configured to amplify the second in-phase RF signal 14I and the second quadrature RF signal 14Q, respectively, based on a second ET voltage $V_{CCB}$. The second ET voltage $V_{CCB}$ may be generated by a second ETIC 32. The second signal combiner 28 is configured to combine the second in-phase RF signal 14I and second quadrature RF signal 14Q after amplification to regenerate the second RF signal 14 for transmission via a second antenna 34.

The conventional ET power amplifier apparatus 10 may be configured to transmit the first RF signal 12 and the second RF signal 14 concurrently based on a multiple-input multiple-output (MIMO) spatial multiplexing scheme or a MIMO diversity scheme. In this regard, the first time-variant power $P_1$ of the first RF signal 12 may be different from the second time-variant power $P_2$ of the second RF signal 14. Accordingly, the first peak power $P_{PEAK1}$ of the first RF signal 12 may be different from the second peak power $P_{PEAK2}$ of the second RF signal 14. As such, the conventional ET power amplifier apparatus 10 needs to employ the two pairs of power amplifiers 20I/20Q and 30I/30Q as well as the pair of ETICs 22 and 32 to amplify the first RF signal 12 and the second RF signal 14 for concurrent transmission. As a result, the conventional ET power amplifier apparatus 10 may have to be built with a higher cost and larger footprint. In this regard, it may be desirable to improve the conventional ET power amplifier apparatus 10 to reduce cost and footprint.

Figure 2:
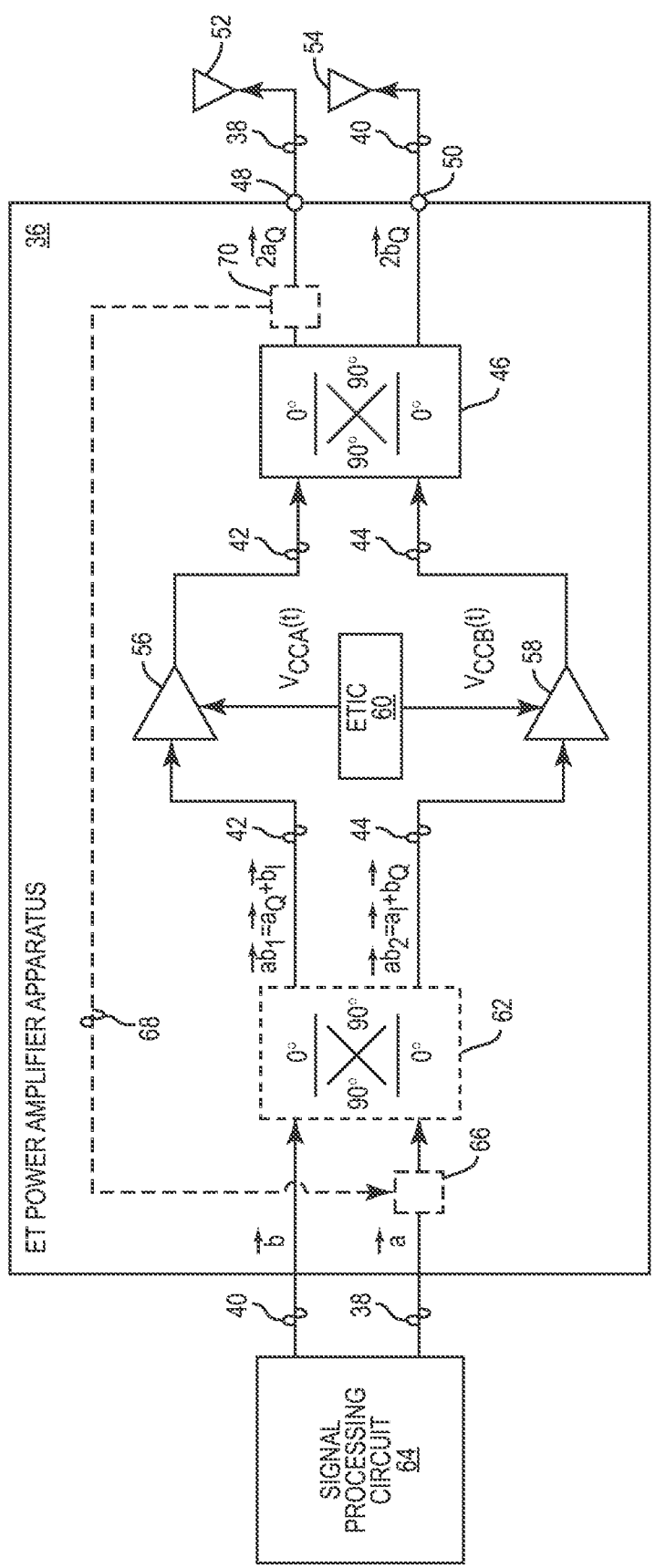
FIG. 2 is a schematic diagram of an exemplary ET power amplifier apparatus configured according to an embodiment of the present disclosure to amplify a pair of RF signals for concurrent transmission with a fewer number of power amplifiers and ETICs than the conventional ET power amplifier apparatus of FIG. 1.

In this regard, FIG. 2 is a schematic diagram of an exemplary ET power amplifier apparatus 36 configured according to an embodiment of the present disclosure to amplify a first RF signal 38 and a second RF signal 40 for concurrent transmission with a fewer number of power amplifier and ETIC than the conventional ET power amplifier apparatus 10 of FIG. 1. In examples discussed herein, the ET power amplifier apparatus 36 is configured to pre-process the first RF signal 38 and the second RF signal 40 before amplification to form a first composite RF signal 42 and a second composite RF signal 44. The ET power amplifier apparatus 36 includes an output circuit 46 configured to re-process the first composite RF signal 42 and the second composite RF signal 44 after amplification to regenerate the first RF signal 38 and the second RF signal 30. The output circuit 46 then provides the first RF signal 38 and the second RF signal 40 to a first signal output 48 and a second signal output 50 for concurrent transmission via a first antenna(s) 52 and a second antenna(s) 54, respectively.

More specifically, the ET power amplifier apparatus 36 is configured to cause the first composite RF signal 42 and the second composite RF signal 44 to be so generated to have substantially similar average power. Accordingly, the ET power amplifier apparatus 36 can amplify the first composite RF signal 42 and the second composite RF signal 44 based on a single pair of power amplifiers, namely a first power amplifier 56 and a second power amplifier 58, and a single ETIC, namely an ETIC 60. As a result, the ET power amplifier apparatus 36 can eliminate one pair of power amplifiers as well as one ETIC from the conventional ET power amplifier apparatus 10, thus making it possible to reduce cost and footprint of the ET power amplifier apparatus 36.

Notably, a key aspect for reducing the number of power amplifiers and ETICs in the ET power amplifier apparatus 36 is to generate the first composite RF signal 42 and the second composite RF signal 44 with substantially similar average power. In this regard, a mathematical analysis is provided below to help explain what the ET power amplifier apparatus 36 needs to do to cause the first composite RF signal 42 and the second composite RF signal 44 to have the substantially similar average power.

To facilitate reference and discussion, the first RF signal 38 and the second RF signal 40 are herein represented by respective baseband vector forms as shown in equations (Eq. 1.1-1.2), respectively.

$$\vec{a} = |a|*e^{\theta_a} \qquad (Eq.\ 1.1)$$

$$\vec{b} = |b|*e^{\theta_b} \qquad (Eq.\ 1.2)$$

In the equations (Eq. 1.1-1.2), $\theta_a$ represents a first phase term of the first RF signal 38 and $\theta_b$ represents a second phase term of the second RF signal 40. In a non-limiting example, the ET power amplifier apparatus 36 includes an input circuit 62 configured to generate the first composite RF signal 42 and the second composite RF signal 44 from the first RF signal 38 and the second RF signal 40. Although the input circuit 62 is shown as being part of the ET power amplifier apparatus 36, it should be appreciated that it is also possible to provide the input circuit 62 outside the ET power amplifier apparatus 36, such as in a signal processing circuit 64 (e.g., a transceiver circuit) coupled externally to the ET power amplifier apparatus 36.

The input circuit 62 can be configured to split the first RF signal $\vec{a}$ into an in-phase component $\vec{a}_I$ and a quadrature component $\vec{a}_Q$, each having one-half (½) the power of the first RF signal $\vec{a}$. Likewise, the input circuit 62 can be configured to split the second RF signal $\vec{b}$ into an in-phase component $\vec{b}_I$ and a quadrature component $\vec{b}_Q$, each having ½ the power of the second RF signal $\vec{b}$.

The input circuit 62 is further configured to generate the first composite RF signal 42, which is represented by vector $\vec{ab}_1$, to include the quadrature component $\vec{a}_Q$ of the first RF signal d and the in-phase component $\vec{b}_I$ of the second RF signal $\vec{b}$ ($\vec{ab}_1 = \vec{a}_Q + \vec{b}_I$). Likewise, the input circuit 62 generates the second composite RF signal 44, which is represented by vector $\vec{ab}_2$, to include the in-phase component $\vec{a}_I$ of the first RF signal $\vec{a}$ and the quadrature component $\vec{b}_Q$ of the second RF signal $\vec{b}$ ($\vec{ab}_2 = \vec{a}_I + \vec{b}_Q$).

Since each of the quadrature component $\vec{a}_Q$ and the in-phase component $\vec{b}_I$ is half-powered, the first composite RF signal 42 is likewise half-powered. Similarly, given that each of the in-phase component $\vec{a}_I$ and the quadrature component $\vec{b}_Q$ is half-powered, the second composite RF signal 44 is also half-powered. As such, it may be possible to configure the first power amplifier 56 and the second power amplifier 58 to operate at half the peak power of the first RF signal 38 and the second RF signal 40, thus helping to improve operating efficiency of the first power amplifier 56 and the second power amplifier 58. Notably, the first RF signal 38 and the second RF signal 40 may correspond to different peak powers. In this regard, each of the first power amplifier 56 and the second power amplifier 58 may be configured to operate at half of a higher peak power between the first RF signal 38 and the second RF signal 40.

The first composite RF signal $\vec{ab}_1$ and the second composite RF signal $\vec{ab}_2$ can also be expressed in complex forms, as shown in the equations (Eq. 2.1-2.2) below.

$$\vec{ab}_1 = j*a_I + b_I = re(b_I) - im(a_I) + j*[im(b_I) + re(a_I)] \quad \text{(Eq. 2.1)}$$

$$\vec{ab}_2 = j*b_I + a_I = re(a_I) - im(b_I) + j*[im(a_I) + re(b_I)] \quad \text{(Eq. 2.2)}$$

In the equations (Eq. 2.1-2.2) above, re( ) represents a real part of a complex expression, im( ) represents an imaginary part of the complex expression, $a_I$ represents amplitude of the in-phase component $\vec{a}_I$, and $b_I$ represents amplitude of the in-phase component $\vec{b}_I$.

The power of the first composite RF signal $\vec{ab}_1$ and the second composite RF signal $\vec{ab}_2$ can be expressed as $|\vec{ab}_1|^2$ and $|\vec{ab}_2|^2$, as shown in the equations (Eq. 3.1-3.2) below.

$$|\vec{ab}_1|^2 = |b_I|^2 + |a_I|^2 - [2*re(b_I)*im(a_I) - im(b_I)*re(a_I)] \quad \text{(Eq. 3.1)}$$

$$|\vec{ab}_2|^2 = |b_I|^2 + |a_I|^2 + [2*re(b_I)*im(a_I) - im(b_I)*re(a_I)] \quad \text{(Eq. 3.2)}$$

In this regard, the power of the first composite RF signal $\vec{ab}_1$ and the second composite RF signal $\vec{ab}_2$ can be generalized as in the equations (Eq. 4.1-4.4) below.

$$|\vec{ab}_1|^2 = \text{Common Power Envelope} - \text{Diff RF Envelope} \quad \text{(Eq. 4.1)}$$

$$|\vec{ab}_2|^2 = \text{Common Power Envelope} + \text{Diff RF Envelope} \quad \text{(Eq. 4.2)}$$

$$\text{Common Power Envelope} = |b_I|^2 + |a_I|^2 \quad \text{(Eq. 4.3)}$$

$$\text{Diff Power Envelope} = 2*re(b_I)*im(a_I) - im(b_I)*re(a_I) \quad \text{(Eq. 4.4)}$$

The first power amplifier 56 and the second power amplifier 58 are configured to amplify the first composite RF signal $\vec{ab}_1$ and the second composite RF signal $\vec{ab}_2$ based on a first ET voltage $V_{CCA}(t)$ and a second ET voltage $V_{CCB}(t)$, respectively. In this regard, the first ET voltage $V_{CCA}(t)$ and the second ET voltage $V_{CCB}(t)$ are related to the power of the first composite RF signal $\vec{ab}_1$, namely $|\vec{ab}_1|^2$, and the second composite RF signal $\vec{ab}_2$, namely $|\vec{ab}_2|^2$. The first ET voltage $V_{CCA}(t)$ and the second ET voltage $V_{CCB}(t)$ can be determined based on the equations (Eq. 5.1-5.3) below.

$$V_{CCA}(t) = \sqrt{R} * \sqrt{\frac{(\text{Common Power Envelope}) -}{(\text{Diff Power Envelope})}} \quad \text{(Eq. 5.1)}$$

$$= \sqrt{R} * \sqrt{(|b_I|^2 + |a_I|^2)} * \sqrt{(1-x)}$$

$$V_{CCAB}(t) = \sqrt{R} * \sqrt{\frac{(\text{Common Power Envelope}) +}{(\text{Diff Power Envelope})}} \quad \text{(Eq. 5.2)}$$

$$= \sqrt{R} * \sqrt{(|b_I|^2 + |a_I|^2)} * \sqrt{(1-x)}$$

$$x = [|bI| + |aI|*\sin(\theta_a - \theta_b)] / [|b_I|^2 + |a_I|^2] \quad \text{(Eq. 5.3)}$$

In the equations (Eq. 5.1 and 5.2) above, R represents a load impedance seen respectively by the first power amplifier 56 and the second power amplifier 58. The equations (Eq. 5.1-5.2) can be further approximated by the equations (Eq. 6.1-6.2) below.

$$V_{CCA}(t) \approx \sqrt{R} * \sqrt{(|b_I|^2 + |a_I|^2)} * (1 - x/2) \quad \text{(Eq. 6.1)}$$

$$V_{CCB}(t) \approx \sqrt{R} * \sqrt{(|b_I|^2 + |a_I|^2)} * (1 + x/2) \quad \text{(Eq. 6.2)}$$

In the equations (Eq. 6.1-6.2), the x-terms are the same as shown in the equation (Eq. 5.3). According to the equations (Eq. 6.1-6.2), the first ET voltage $V_{CCA}(t)$ and the second ET voltage $V_{CCB}(t)$ can have a same average value $\sqrt{R} * \sqrt{(|b_I|^2 + |a_I|^2)}$ if the x-terms can be averaged out. Accordingly, the first composite RF signal 42 and the second composite RF signal 44 may have a substantially equal average power that equals the Common Power Envelope $|b_I|^2 + |a_I|^2$, as expressed in the equation (Eq. 4.3). In this regard, the first composite RF signal 42 and the second composite RF signal 44 can have the substantially equal average power $|b_I|^2 + |a_I|^2$ regardless of whether the first RF signal 38 and the second RF signal 40 are associated with an identical power envelope (e.g., $a_I = b_I$) or different power envelopes (e.g., $a_I \neq b_I$). As a result, it may be possible to employ fewer numbers of power amplifiers and ETICs in the ET power amplifier apparatus 36.

To average out the x-terms in the equations (Eq. 6.1-6.2), it may be necessary to average out the $\sin(\theta_a - \theta_b)$ in the equation (Eq. 5.3). Notably, the $\sin(\theta_a - \theta_b)$ can be inherently averaged out when the first RF signal 38 and the second RF signal 40 are uncorrelated signals. For example, when the ET power amplifier apparatus 36 is configured to transmit the first RF signal 38 and the second RF signal 40 concurrently to support MIMO spatial multiplexing, the first RF signal 38 and the second RF signal 40 may be different signals. As such, the first phase term $\theta_a$ of the first RF signal 38 and the second phase term $\theta_b$ of the second RF signal 40 may be uncorrelated. As a result, the $\sin(\theta_a - \theta_b)$ may be averaged out in the equation (Eq. 5.3) to cause the x-terms in the equations (Eq. 6.1-6.2) to become zero.

However, when the ET power amplifier apparatus 36 is configured to transmit the first RF signal 38 and the second RF signal 40 concurrently to support MIMO diversity, the first RF signal 38 and the second RF signal 40 may be the same signal. As such, the first phase term $\theta_a$ of the first RF signal 38 and the second phase term $\theta_b$ of the second RF signal 40 may be correlated to achieve phase coherency. In this regard, it may be necessary to make the first phase term $\theta_a$ and the second phase term $\theta_b$ uncorrelated by including at least one phase adjuster 66 in the ET power amplifier apparatus 36. In a non-limiting example, the phase adjuster 66 can be provided between the signal processing circuit 64 and the input circuit 62 and configured to adjust at least one of the first phase term $\theta_a$ and the second phase term $\theta_b$ such that the first phase term $\theta_a$ and the second phase term $\theta_b$ can become uncorrelated. For example, the phase adjuster 66 can adjust the first phase term $\theta_a$ based on a feedback signal 68 indicative of an average differential between the first ET voltage $V_{CCA}(t)$ and the second ET voltage $V_{CCB}(t)$. The ET power amplifier apparatus 36 may include a measurement circuit 70 configured to measure the average differential between the first ET voltage $V_{CCA}(t)$ and the second ET voltage $V_{CCB}(t)$ and generate the feedback signal 68.

Figure 3:
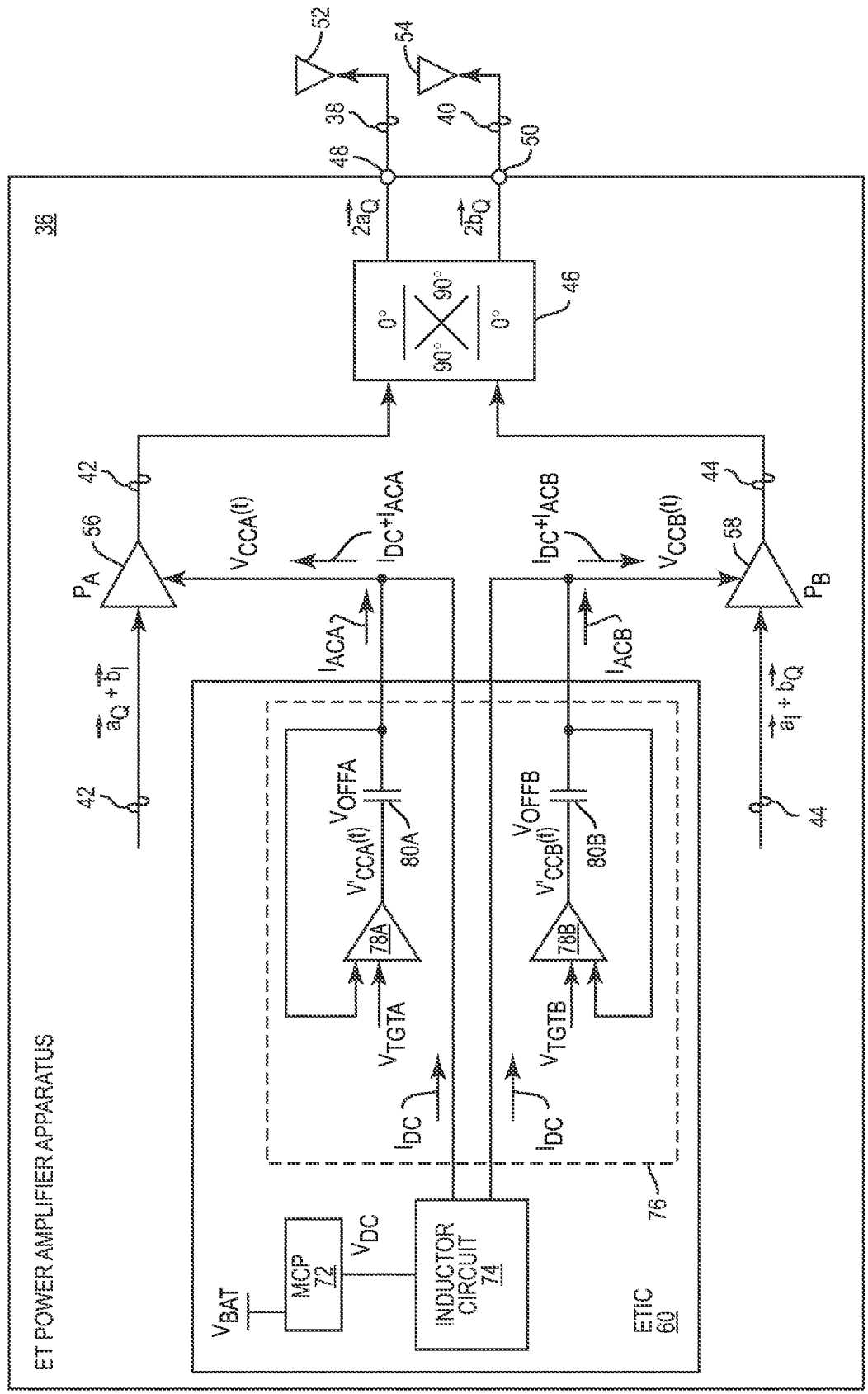
FIG. 3 is a schematic diagram providing a further illustration of the ET power amplifier apparatus of FIG. 2.

By averaging out the x-terms in the equations (Eq. 6.1-6.2), it may be possible to make the first ET voltage $V_{CCA}(t)$ and the second ET voltage $V_{CCB}(t)$ have the same average value $\sqrt{R} * \sqrt{(|b_I|^2 + |a_I|^2)}$, thus making it possible to employ only the ETIC 60 to provide the first ET voltage $V_{CCA}(t)$ and the second ET voltage $V_{CCB}(t)$. In this regard, FIG. 3 is a schematic diagram providing a further illustration of the ETIC 60 in the ET power amplifier apparatus 36 of FIG. 2. Common elements between FIGS. 2 and 3 are shown therein with common element numbers and will not be re-described herein.

The ETIC 60 includes a multi-level charge pump (MCP) 72 and an inductor circuit 74. The MCP 72 is configured to generate a low-frequency voltage $V_{DC}$ (e.g., a constant voltage) at multiple levels based on a battery voltage $V_{BAT}$. In a non-limiting example, the MCP 72 can be configured to generate the low-frequency voltage $V_{DC}$ at 0 V, $V_{BAT}$, or $2*V_{BAT}$. The inductor circuit 74 is configured to induce a low-frequency current $I_{DC}$ (e.g., a direct current) based on the low-frequency voltage $V_{DC}$. The inductor circuit 74 is coupled to the first power amplifier 56 and the second power amplifier 58 to provide the low-frequency IDC to the first power amplifier 56 and the second power amplifier 58.

In one embodiment, the ETIC 60 includes an ET voltage circuit 76. The ET voltage circuit 76 is configured to generate and provide the first ET voltage $V_{CCA}(t)$ and the second ET voltage $V_{CCB}(t)$ to the first power amplifier 56 and the second power amplifier 58, respectively. In a specific example, the ET voltage circuit 76 includes a first voltage amplifier 78A, a first offset capacitor 80A, a second voltage amplifier 78B, and a second offset capacitor 80B. The first voltage amplifier 78A is configured to generate a first initial ET voltage $V'_{CCA}(t)$ based on a first ET target voltage $V_{TGTA}$. The first offset capacitor 80A is configured to raise the first initial ET voltage $V'_{CCA}(t)$ by a first offset voltage $V_{OFFA}$ to generate the first ET voltage $V_{CCA}(t)$ ($V_{CCA}(t)=V'_{CCA}(t)+V_{OFFA}$). Similarly, the second voltage amplifier 78B is configured to generate a second initial ET voltage $V'_{CCB}(t)$ based on a second ET target voltage $V_{TGTB}$. The second offset capacitor 80B is configured to raise the second initial ET voltage $V'_{CCB}(t)$ by a second offset voltage $V_{OFFB}$ to generate the second ET voltage $V_{CCB}(t)$ ($V_{CCB}(t)=V'_{CCB}(t)+V_{OFFB}$).

According to the previous discussion, the ET voltage circuit 76 can be configured to generate the first ET voltage $V_{CCA}(t)$ and the second ET voltage $V_{CCB}(t)$ having the same average value $\sqrt{R}*\sqrt{(|b_I|^2+|a_I|^2)}$. Accordingly, the first power amplifier 56 may operate based on a first average power $P_A$ corresponding to the first ET voltage $V_{CCA}(t)$ and the low frequency current $I_{DC}$ ($P_A=V_{CCA}(t)*I_{DC}$). Likewise, the second power amplifier 58 may operate based on a second average power $P_B$ corresponding to the second ET voltage $V_{CCB}(t)$ and the low frequency current $I_{DC}$ ($P_B=V_{CCB}(t)*I_{DC}$). As such, it may be possible to share the MCP 72 and the inductor circuit 74 between the first power amplifier 56 and the second power amplifier 58, thus helping to reduce cost and footprint of the ET power amplifier apparatus 36.

Notably, the first ET voltage $V_{CCA}(t)$ and the second ET voltage $V_{CCB}(t)$ can only have the same average value $\sqrt{R}*\sqrt{(|b_I|^2+|a_I|^2)}$ if the x-terms in the equations (Eq. 6.1-6.2) can be averaged out. In other words, the first ET voltage $V_{CCA}(t)$ and the second ET voltage $V_{CCB}(t)$ may not be exactly the same if the x-terms in the equations (Eq. 6.1-6.2) are not completely averaged out. In this regard, to make the first average power $P_A$ the same as the second average power $P_B$, the first voltage amplifier 78A and/or the second voltage amplifier 78B may be configured to source a first high-frequency current $I_{ACA}$ (e.g., an alternating current) and/or a second high-frequency current $I_{ACB}$ (e.g., an alternating current) to the first power amplifier 56 and/or the second power amplifier 58. Accordingly, the first average power $P_A$ of the first power amplifier 56 can be made to correspond to the first ET voltage $V_{CCA}(t)$, the low frequency current $I_{DC}$, and the first high-frequency current $I_{ACA}$, $P_A=V_{CCA}(t)*(I_{DC}+I_{ACA})$. Similarly, the second average power $P_B$ of the second power amplifier 58 can be made to correspond to the second ET voltage $V_{CCB}(t)$, the low frequency current $I_{DC}$, and the second high-frequency current $I_{ACB}$, $P_A=V_{CCB}(t)*(I_{DC}+I_{ACB})$. As a result, the first average power $P_A$ of the first power amplifier 56 can be kept the same as the second average power $P_B$ of the second power amplifier 58, even if the x-terms in the equations (Eq. 6.1-6.2) are not completely averaged out.

Figure 4B:
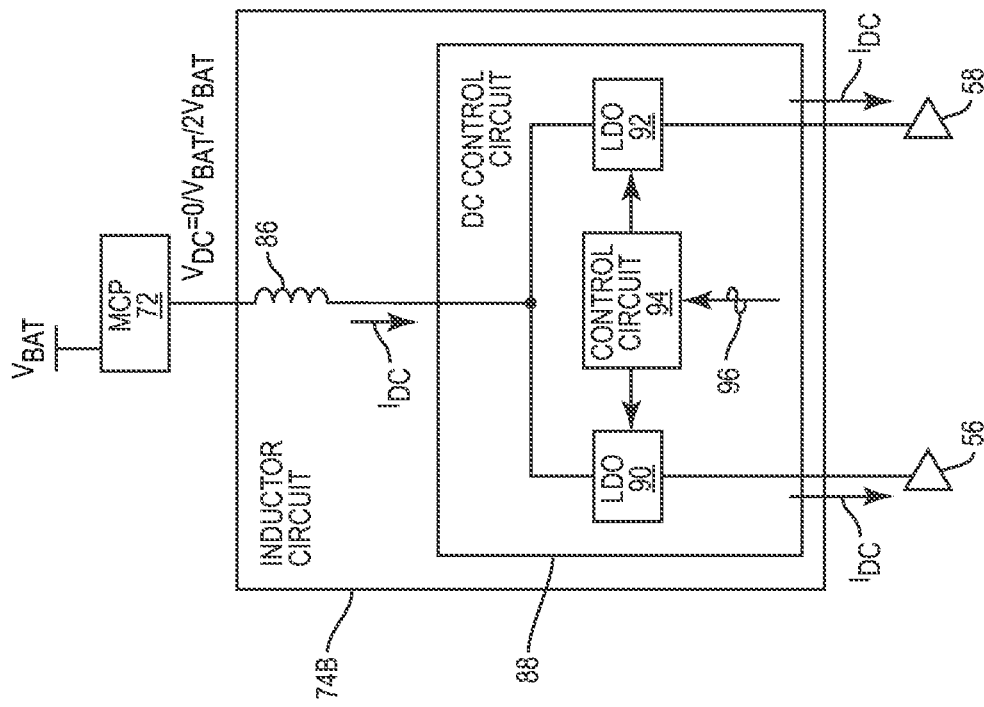
FIGS. 4A-4B are schematic diagrams of exemplary inductor circuits configured according to embodiments of the present disclosure and can be provided in the ET power amplifiers of FIG. 3.
Figure 4A:
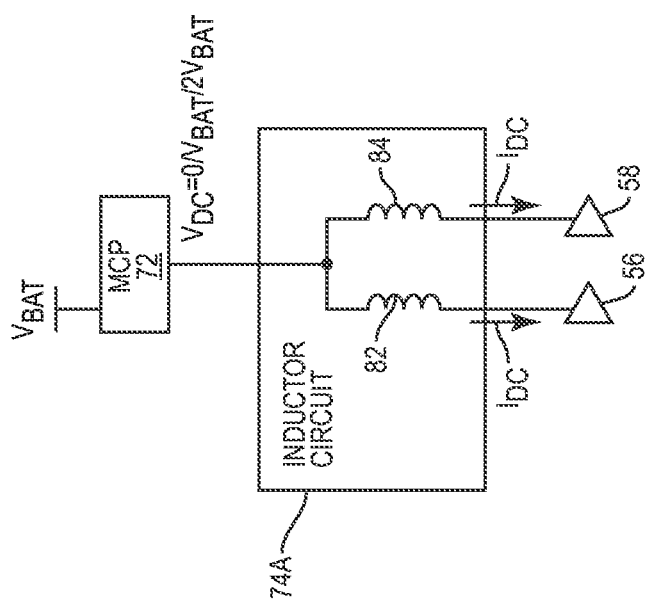

The inductor circuit 74 may be provided based on a number of embodiments, as described next in FIGS. 4A and 4B. In this regard, FIG. 4A-4B are schematic diagrams providing an exemplary illustration of the inductor circuit 74 in the ET power amplifier apparatus 36 of FIG. 3 configured according to different embodiments of the present disclosure. Common elements between FIGS. 3, 4A, and 4B are shown therein with common element numbers and will not be re-described herein.

FIG. 4A is a schematic diagram of an exemplary inductor circuit 74A, which can be provided as the inductor circuit 74 in the ETIC 60 of FIG. 3. The inductor circuit 74A includes a first power inductor 82 and a second power inductor 84. The first power inductor 82 is coupled between the MCP 72 and the first power amplifier 56. The first power inductor 82 is configured to generate the low-frequency current $I_{DC}$ based on the low-frequency voltage $V_{DC}$ and provide the low-frequency current $I_{DC}$ to the first power amplifier 56. The second power inductor 84 is coupled between the MCP 72 and the second power amplifier 58. The second power inductor 84 is configured to generate the low-frequency current $I_{DC}$ based on the low-frequency voltage $V_{DC}$ and provide the low-frequency current $I_{DC}$ to the second power amplifier 58. By employing the first power inductor 82 and the second power inductor 84 in the inductor circuit 74A, it may be possible to provide isolation between the first power amplifier 56 and the second power amplifier 58. In a non-limiting example, the first power inductor 82 and the second power inductor 84 can be negatively coupled.

FIG. 4B is a schematic diagram of an exemplary inductor circuit 74B, which can be provided as the inductor circuit 74 in the ETIC 60 of FIG. 3. The inductor circuit 74B includes a power inductor 86 coupled to the MCP 72 and configured to generate the low-frequency current $I_{DC}$ based on the low-frequency voltage $V_{DC}$.

As previously described in FIG. 3, the first ET voltage $V_{CCA}(t)$ and the second ET voltage $V_{CCB}(t)$ can only have the same average value $\sqrt{R}*\sqrt{(|b_I|^2+|a_I|^2)}$ if the x-terms in the equations (Eq. 6.1-6.2) can be averaged out. As such, the first average $P_A$ of the first power amplifier 56 and the second average power $P_B$ of the second power amplifier 58 may be affected if the x-terms in the equations (Eq. 6.1-6.2) are not completely averaged out. Alternative to configuring the first voltage amplifier 78A and/or the second voltage amplifier 78B to source the first high-frequency current $I_{ACA}$ and/or the second high-frequency current $I_{ACB}$, it may also be possible to adjust the low-frequency current $I_{DC}$ flowing into the first power amplifier 56 and/or the second power amplifier 58 to make the first average power $P_A$ the same as the second average power $P_B$.

In this regard, the inductor circuit 74B may be configured to include a DC control circuit 88 to couple the power inductor 86 to the first power amplifier 56 and the second power amplifier 58. In a non-limiting example, the DC control circuit 88 includes a first low-dropout regulator (LDO) 90 and a second LDO 92. The first LDO 90 is coupled between the power inductor 86 and the first power amplifier 56 to regulate the low-frequency current $I_{DC}$ flowing into the first power amplifier 56. The second LDO 92 is coupled between the power inductor 86 and the second power amplifier 58 to regulate the low-frequency current $I_{DC}$ flowing into the second power amplifier 58.

The DC control circuit 88 may be configured to include a control circuit 94. The control circuit 94 may be configured to detect a maximum instantaneous voltage differential between the first ET voltage $V_{CC_A}(t)$ and the second ET voltage $V_{CC_B}(t)$. Accordingly, the control circuit 94 may control the first LDO 90 and/or the second LDO 92 to regulate the low-frequency current $I_{DC}$ flowing into the first power amplifier 56 and/or the second power amplifier 58 to make the first average power $P_A$ identical to the second average power $P_B$. In a non-limiting example, the control circuit 94 may detect the maximum instantaneous voltage differential between the first ET voltage $V_{CC_A}(t)$ and the second ET voltage $V_{CC_B}(t)$ based on an indication signal 96, which may provide feedback of the first ET voltage $V_{CC_A}(t)$ and the second ET voltage $V_{CC_B}(t)$, or feedback of the first ET target voltage $V_{TGT_A}$ and the second ET target voltage $V_{TGT_B}$.

The first LDO 90 and the second LDO 92 may also operate as switches to cut off the low-frequency current $I_{DC}$ from any of the first power amplifier 56 and the second power amplifier 58. For example, when the ET power amplifier apparatus 36 is configured to transmit only the first RF signal 38, the first power amplifier 56 may be configured to amplify the first RF signal 38 directly and the second power amplifier 58 may be deactivated to help conserve energy. As such, the control circuit 94 may control the second LDO 92 to function as a switch to decouple the second power amplifier 58 from the power inductor 86, thus cutting off the low-frequency current $I_{DC}$ from the second power amplifier 58.

Figure 5:
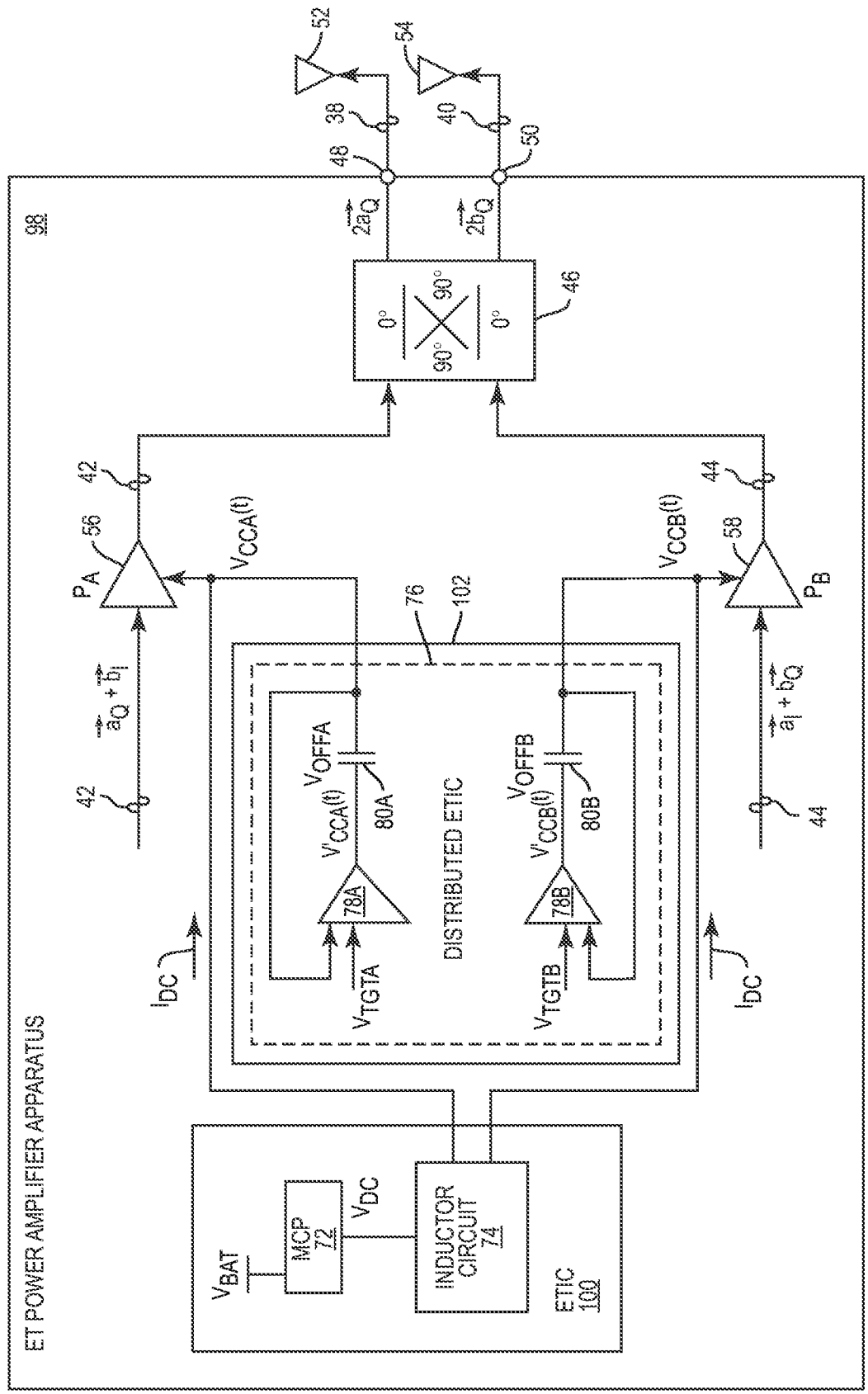
FIG. 5 is a schematic diagram of an ET power amplifier apparatus configured according to another embodiment of the present disclosure.

Alternative to incorporating the ET voltage circuit 76 into the ETIC 60, as illustrated previously in FIG. 3, it may also be possible to provide the ET voltage circuit 76 in a circuit that is separate from the ETIC 60. For example, the ETIC 60 may be provided in one system-on-chip (SoC) and the ET voltage circuit 76 may be provided in a separate SoC. In this regard, FIG. 5 is a schematic diagram of an exemplary ET power amplifier apparatus 98 configured according to another embodiment of the present disclosure. Common elements between FIGS. 3 and 5 are shown therein with common element numbers and will not be re-described herein.

As shown in FIG. 5, the ET power amplifier apparatus 98 includes an ETIC 100 and a distributed ETIC 102. The ETIC 100 includes the MCP 72 and the inductor circuit 74. The distributed ETIC 102 includes the ET voltage circuit 76. The distributed ETIC 102 may be provided in close proximity to the first power amplifier 56 and the second power amplifier 58 to help reduce trace inductance (e.g., to below 0.1 nH) to mitigate potential distortion in the first ET voltage $V_{CC_A}(t)$ and the second ET voltage $V_{CC_B}(t)$.

Figure 6:
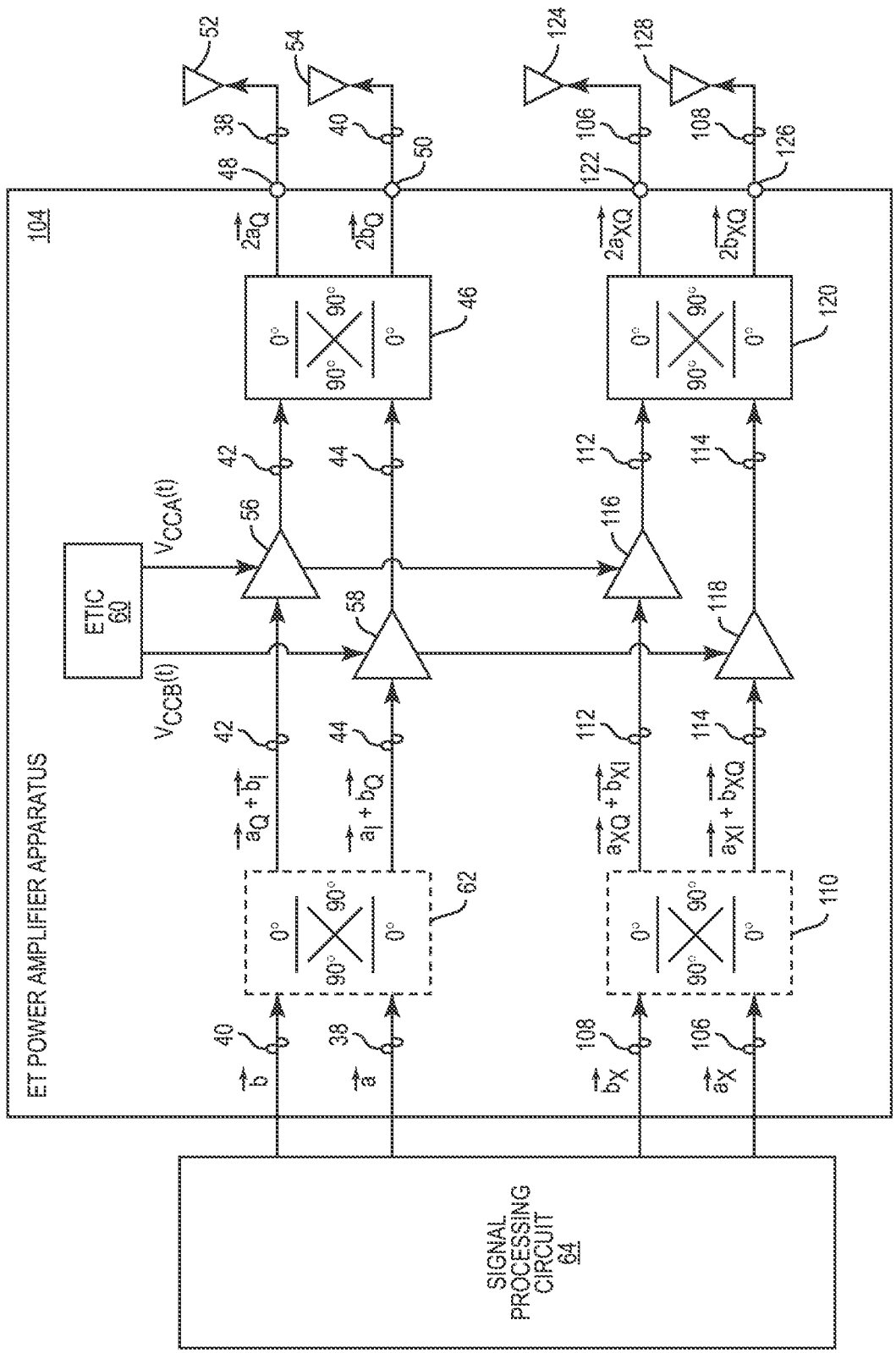
FIG. 6 is a schematic diagram of an exemplary ET power amplifier apparatus configured according to another embodiment of the present disclosure.

The ET power amplifier apparatus 36 of FIG. 2 can be configured to concurrently transmit additional RF signals via additional antennas. In this regard, FIG. 6 is a schematic diagram of an exemplary ET power amplifier apparatus 104 configured according to another embodiment of the present disclosure. Common elements between FIGS. 2 and 6 are shown therein with common element numbers and will not be re-described herein.

The signal processing circuit 64 can be configured to generate at least one third RF signal 106 (also denoted as $\vec{a}_X$) and at least one fourth RF signal 108 (also denoted as $\vec{b}_X$). The ET power amplifier apparatus 104 may include at least one second input circuit 110 configured to split the third RF signal $\vec{a}_X$ into an in-phase component $\vec{a}_{XI}$ and a quadrature component $\vec{a}_{XQ}$, each having one-half (½) the power of the third RF signal $\vec{a}_X$. Likewise, the second input circuit 110 can be configured to split the fourth RF signal $\vec{b}_X$ into an in-phase component $\vec{b}_{XI}$ and a quadrature component $\vec{b}_{XQ}$, each having ½ the power of the second RF signal $\vec{b}_X$.

The second input circuit 110 is further configured to generate a third composite RF signal 112 that includes the quadrature component $\vec{a}_{XQ}$ of the third RF signal $\vec{a}_X$ and the in-phase component $\vec{b}_{XI}$ of the second RF signal $\vec{b}_X$. Likewise, the second input circuit 110 can also generate a fourth composite RF signal 114 that includes the in-phase component $\vec{a}_{XI}$ of the third RF signal $\vec{a}_X$ and the quadrature component $\vec{b}_{XQ}$ of the fourth RF signal $\vec{b}_X$.

The ET power amplifier apparatus 104 can also include at least one third power amplifier 116 and at least one fourth power amplifier 118 configured to amplify the third composite RF signal 112 and the fourth composite RF signal 114 based on the first ET voltage $V_{CC_A}(t)$ and the second ET voltage $V_{CC_B}(t)$, respectively. The ET power amplifier apparatus 104 can include at least one second output circuit 120 configured to regenerate the third RF signal 106 and the fourth RF signal 108 from the third composite RF signal 112 and the fourth composite RF signal 114. The ET power amplifier apparatus 104 can include at least one third signal output 122 coupled to at least one third antenna 124 and at least one fourth signal output 126 coupled to at least one fourth antenna 128. The second output circuit 120 is further configured to provide the third RF signal 106 and the fourth RF signal 108 to the third signal output 122 and the fourth signal output 126, respectively. In this regard, the ET power amplifier apparatus 104 can be configured to concurrently transmit the first RF signal 38, the second RF signal 40, the third RF signal 106, and the fourth RF signal 108.

In one example, the first RF signal 38, the second RF signal 40, the third RF signal 106, and the fourth RF signal 108 can be identical RF signals. In this regard, the ET power amplifier apparatus 104 may support four-by-four (4×4) MIMO diversity by concurrently transmitting the first RF signal 38, the second RF signal 40, the third RF signal 106, and the fourth RF signal 108. In another example, the first RF signal 38, the second RF signal 40, the third RF signal 106, and the fourth RF signal 108 can be different RF signals. In this regard, the ET power amplifier apparatus 104 may support 4×4 MIMO spatial multiplexing by concurrently transmitting the first RF signal 38, the second RF signal 40, the third RF signal 106, and the fourth RF signal 108.

Understandably, the ET power amplifier apparatus 104 may be further configured to include additional input circuits, additional power amplifiers, and additional output circuits to concurrently transmit additional RF signals via additional antennas. As such, the ET power amplifier apparatus 104 can be configured to support massive-MIMO and RF beamforming in a millimeter wave (mmWave) spectrum.

Those skilled in the art will recognize improvements and modifications to the preferred embodiments of the present disclosure. All such improvements and modifications are considered within the scope of the concepts disclosed herein and the claims that follow.

What is claimed is:

1. An envelope tracking (ET) power amplifier apparatus comprising:
    a first signal output coupled to a first antenna;
    a second signal output coupled to a second antenna;
    a first power amplifier configured to amplify a first composite radio frequency (RF) signal comprising a quadrature component of a first RF signal and an in-phase component of a second RF signal based on a first ET voltage;
    a second power amplifier configured to amplify a second composite RF signal comprising an in-phase component of the first RF signal and a quadrature component of the second RF signal based on a second ET voltage;
    an input circuit coupled to a signal processing circuit and configured to:
        receive the first RF signal and the second RF signal from the signal processing circuit;
        generate the first composite RF signal comprising the quadrature component of the first RF signal and the in-phase component of the second RF signal;
        generate the second composite RF signal comprising the in-phase component of the first RF signal and the quadrature component of the second RF signal; and
        provide the first composite RF signal and the second composite RF signal to the first power amplifier and the second power amplifier, respectively; and
    an output circuit configured to:
        receive the first composite RF signal and the second composite RF signal from the first power amplifier and the second power amplifier, respectively;
        regenerate the first RF signal and the second RF signal from the first composite RF signal and the second composite RF signal; and
        provide the first RF signal and the second RF signal to the first signal output and the second signal output, respectively.

2. The ET power amplifier apparatus of claim 1 wherein the first power amplifier and the second power amplifier are further configured to receive the first composite RF signal and the second composite RF signal, respectively, from the signal processing circuit coupled to the ET power amplifier apparatus.

3. The ET power amplifier apparatus of claim 1 wherein the first composite RF signal and the second composite RF signal are generated to have a substantially equal average power.

4. The ET power amplifier apparatus of claim 3 wherein the first RF signal and the second RF signal are associated with an identical power envelope.

5. The ET power amplifier apparatus of claim 3 wherein the first RF signal and the second RF signal are associated with different power envelopes.

6. The ET power amplifier apparatus of claim 1 further comprising at least one phase adjuster configured to phase shift at least one of the first RF signal and the second RF signal based on a feedback signal indicative of an average differential between the first ET voltage and the second ET voltage.

7. The ET power amplifier apparatus of claim 6 further comprising a measurement circuit coupled to the output circuit and configured to measure the average differential between the first ET voltage and the second ET voltage.

8. The ET power amplifier apparatus of claim 1 further comprising an ET integrated circuit (ETIC), the ETIC comprises:
    a multi-level charge pump (MCP) configured to generate a low-frequency voltage at a plurality of levels based on a battery voltage; and
    an inductor circuit configured to:
        generate a low-frequency current based on the low-frequency voltage; and
        provide the low-frequency current to the first power amplifier and the second power amplifier.

9. The ET power amplifier apparatus of claim 8 wherein the ETIC further comprises an ET voltage circuit configured to generate and provide the first ET voltage and the second ET voltage to the first power amplifier and the second power amplifier, respectively.

10. The ET power amplifier apparatus of claim 9 wherein the ET voltage circuit comprises:
    a first voltage amplifier configured to generate a first initial ET voltage based on a first ET target voltage;
    a first offset capacitor configured to raise the first initial ET voltage by a first offset voltage to generate the first ET voltage;
    a second voltage amplifier configured to generate a second initial ET voltage based on a second ET target voltage; and
    a second offset capacitor configured to raise the second initial ET voltage by a second offset voltage to generate the second ET voltage.

11. The ET power amplifier apparatus of claim 8 further comprising a distributed ETIC, the distributed ETIC comprising an ET voltage circuit configured to generate and provide the first ET voltage and the second ET voltage to the first power amplifier and the second power amplifier, respectively.

12. The ET power amplifier apparatus of claim 11 wherein the ET voltage circuit comprises:
    a first voltage amplifier configured to generate a first initial ET voltage based on a first ET target voltage;
    a first offset capacitor configured to raise the first initial ET voltage by a first offset voltage to generate the first ET voltage;
    a second voltage amplifier configured to generate a second initial ET voltage based on a second ET target voltage; and
    a second offset capacitor configured to raise the second initial ET voltage by a second offset voltage to generate the second ET voltage.

13. The ET power amplifier apparatus of claim 11 wherein the distributed ETIC is separated from the ETIC.

14. The ET power amplifier apparatus of claim 8 wherein the inductor circuit comprises:
    a first power inductor coupled between the MCP and the first power amplifier, the first power inductor configured to induce the low-frequency current based on the low-frequency voltage and provide the low-frequency current to the first power amplifier; and
    a second power inductor coupled between the MCP and the second power amplifier, the second power inductor configured to induce the low-frequency current based on the low-frequency voltage and provide the low-frequency current to the second power amplifier.

15. The ET power amplifier apparatus of claim 14 wherein the first power inductor and the second power inductor are negatively coupled.

16. The ET power amplifier apparatus of claim 8 wherein the inductor circuit comprises a power inductor configured to generate the low-frequency current based on the low-frequency voltage.

17. The ET power amplifier apparatus of claim 16 further comprising a direct current (DC) control circuit, the DC control circuit comprising:
   a first low-dropout regulator (LDO) coupled between the power inductor and the first power amplifier and configured to regulate the low-frequency current flowing into the first power amplifier;
   a second LDO coupled between the power inductor and the second power amplifier and configured to regulate the low-frequency current flowing into the second power amplifier; and
   a control circuit coupled to the first LDO and the second LDO and configured to:
      detect a maximum instantaneous voltage differential between the first ET voltage and the second ET voltage; and
      control the first LDO and the second LDO to regulate the low-frequency current based on the detected maximum instantaneous voltage differential.

18. The ET power amplifier apparatus of claim 17 wherein the control circuit is further configured to control any one of the first LDO and the second LDO to prevent the low-frequency current from flowing into any one of the first power amplifier and the second power amplifier.

* * * * *

UNITED STATES PATENT AND TRADEMARK OFFICE
CERTIFICATE OF CORRECTION

PATENT NO. : 11,398,852 B2
APPLICATION NO. : 16/742976
DATED : July 26, 2022
INVENTOR(S) : Khlat It is certified that error appears in the above-identified patent and that said Letters Patent is hereby corrected as shown below:

In the Specification

Column 6, Line 45, replace "signal d" with --signal $\vec{a}$ --.

Signed and Sealed this
Thirtieth Day of August, 2022

Katherine Kelly Vidal
*Director of the United States Patent and Trademark Office*